United States Patent [19]

Tojo et al.

[11] 4,455,501
[45] Jun. 19, 1984

[54] PRECISION ROTATION MECHANISM

[75] Inventors: Toru Tojo, Yamato; Kazuyoshi Sugihara, Kawasaki, both of Japan

[73] Assignee: Tokyo Shibaura Denki Kabushiki Kaisha, Kawasaki, Japan

[21] Appl. No.: 429,230

[22] Filed: Sep. 30, 1982

[30] Foreign Application Priority Data

Feb. 9, 1982 [JP] Japan .................................. 57-19328
Apr. 28, 1982 [JP] Japan .................................. 57-72422
Apr. 28, 1982 [JP] Japan .................................. 57-72423

[51] Int. Cl.³ ............................................ H01L 41/08
[52] U.S. Cl. .................................................... 310/328
[58] Field of Search ........................... 310/328, 345, 26

[56] References Cited

U.S. PATENT DOCUMENTS 3,377,489  4/1968  Yamato ................................. 310/328
3,952,215  4/1976  Sakitani ................................ 310/328

FOREIGN PATENT DOCUMENTS

39-52215  8/1964  Japan .
51-12497  4/1976  Japan .
399036  11/1973  U.S.S.R. ............................... 310/328
604057  4/1978  U.S.S.R. ............................... 310/328
674123  7/1979  U.S.S.R. ............................... 310/328

*Primary Examiner*—J. D. Miller
*Assistant Examiner*—D. L. Rebsch
*Attorney, Agent, or Firm*—Oblon, Fisher, Spivak, McClelland & Maier

[57] ABSTRACT

In a precision rotation mechanism, first and second sections of a rotatable disk member are alternately rotated. The first and second sections are coupled together with an elastic hinge which is provided in the center region of the disk. The first and second sections are also coupled with piezoelectric elements. After the first section is locked by a stopper, the piezoelectric element is elongated in a direction and the piezoelectric element is contracted in a direction, whereby the second section is rotated in a direction. Then, the second section is locked by the stopper and the first section is released from the stopper. In this state, one piezoelectric element is contracted and the other piezoelectric element is elongated so that the first section is rotated.

24 Claims, 27 Drawing Figures

PRECISION ROTATION MECHANISM

BACKGROUND OF THE INVENTION

This invention relates to a fine or precision rotation mechanism for slightly rotating an object to a desired position with high precision.

Recently, an electron beam drawing system, a reduced scale projection type transfer system and an X-ray lithography system have been developed as a system for forming a fine pattern on an object such as a semiconductor wafer and a mask substrate. This type of apparatus requires a driving mechanism for slightly moving a sample with great precision on the order of submicrons. High precision fine driving mechanisms are required not only for the systems mentioned above, but also in fields where precise measurement is required.

Fine driving mechanisms include those in which an object is moved linearly in one direction and those in which an object is rotated. The prior art fine rotation mechanisms for causing rotational motion have the following problems. With a driving mechanism where the rotational stroke is large, it is difficult to obtain a slight motion. On the other hand, with a driving mechanism where slight motion is possible, it is impossible to provide a large rotational stroke.

For example, a literature entitled "Operating Characteristics of Motor-Driven Positioning Mechanisms" Autumn Meeting of the Precision Machine Association, 1976, p. 359, discloses a rotation mechanism in which a material having a piezoelectric effect is stressed to produce a rotational motion. With this rotation mechanism, an object can be moved only very slightly in an area with a radius of 29 mm for a very small rotational stroke of $+2$ $\mu$m. A rotation mechanism which is used of the piezoelectric effect is disclosed in U.S. Pat. No. 3,952,215 issued Apr. 20, 1976, "Stepwise Fine Adjustment", Sakitani. The disclosed machine is of a type in which an object is moved linearly and stepwise. To convert this motion to a rotational motion, it is necessary to use a conventional rotational table having a bearing. Further, to avoid rattling, it is necessary to use a rotation mechanism using a cantilever system or the like making use of the elastic deformation of a material. In this apparatus, the rotational stroke cannot be much increased. If it is increased too much, the bearing provided in the rotational table is liable to rattle. The rotational mechanism having a cantilever again cannot solve the problem of the insufficient rotational stroke.

SUMMARY OF THE INVENTION

An object of the invention is to provide a fine moving mechanism, which can move an object slightly, can provide a sufficiently large rotational stroke and can eliminate rattling when driving the object.

According to the invention, there is provided a fine rotation mechanism which comprises a base having a surface, a rotor rotatably mounted on the surface of the base and having first and second sections, means for defining the rotation center of the rotor, a first piezoelectric element capable of elongation and contraction which is coupled between the first and second sections of the rotor in the direction of elongation and contraction, a first and a second stopper for locking the respective first and second sections against rotation, means for driving the first and second stoppers to lock the second section after driving the first stopper to lock the first section and then driving the first stopper to release the first section, and a first signal generating means for generating a first voltage signal applied to the first piezoelectric element, the first piezoelectric element being elongated or contracted according to the first voltage signal while one of the two sections is held locked by the corresponding stopper.

According to the invention, there is also provided a fine moving mechanism, which comprises a base having a surface, a rotor rotatably mounted on the base and having first, second and third sections, first, second and third piezoelectric elements capable of elongation and contraction, the first piezoelectric element being coupled between the first and second sections, the second piezoelectric element being coupled between the second and third sections and the third piezoelectric element being coupled between the third and first sections, first, second and third stoppers for locking the respective first, second and third sections against rotation, means for driving the stoppers for locking the corresponding sections, and means for generating a voltage signal applied to each piezoelectric element for causing elongation or contraction thereof, the rotor being linearly moved or rotated with elongation or contraction of given piezoelectric elements caused by corresponding stoppers driven by said stopper driving means.

DETAILED DESCRIPTION OF THE PREFERRED EMBODIMENTS

Figure 1:
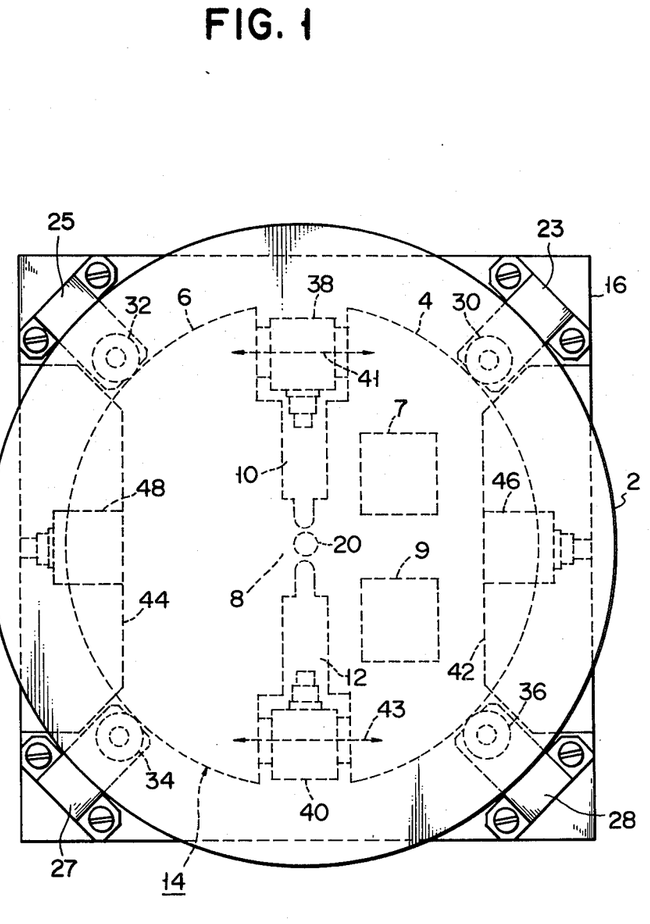
FIG. 1 is a plan view showing an embodiment of the fine rotation mechanism according to the invention.
Figure 2:
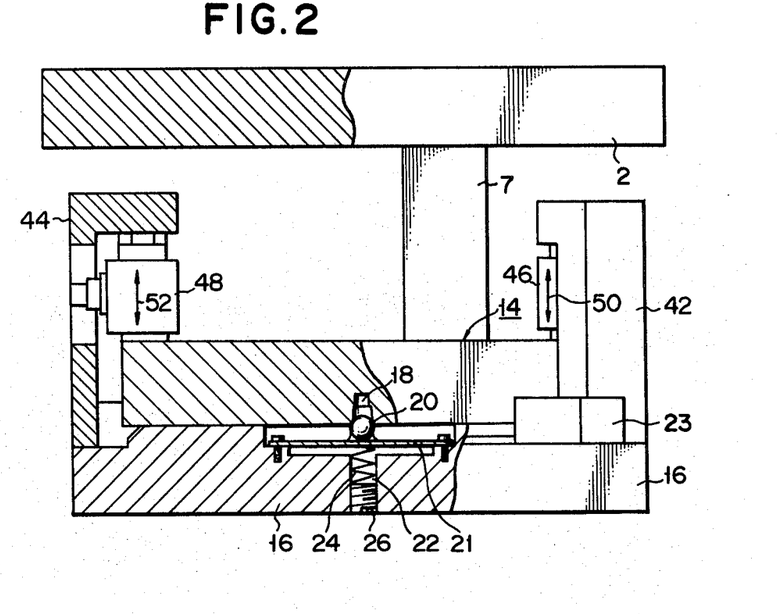
FIG. 2 is a longitudinal sectional view showing the fine rotation mechanism shown in FIG. 1.
Figure 3:
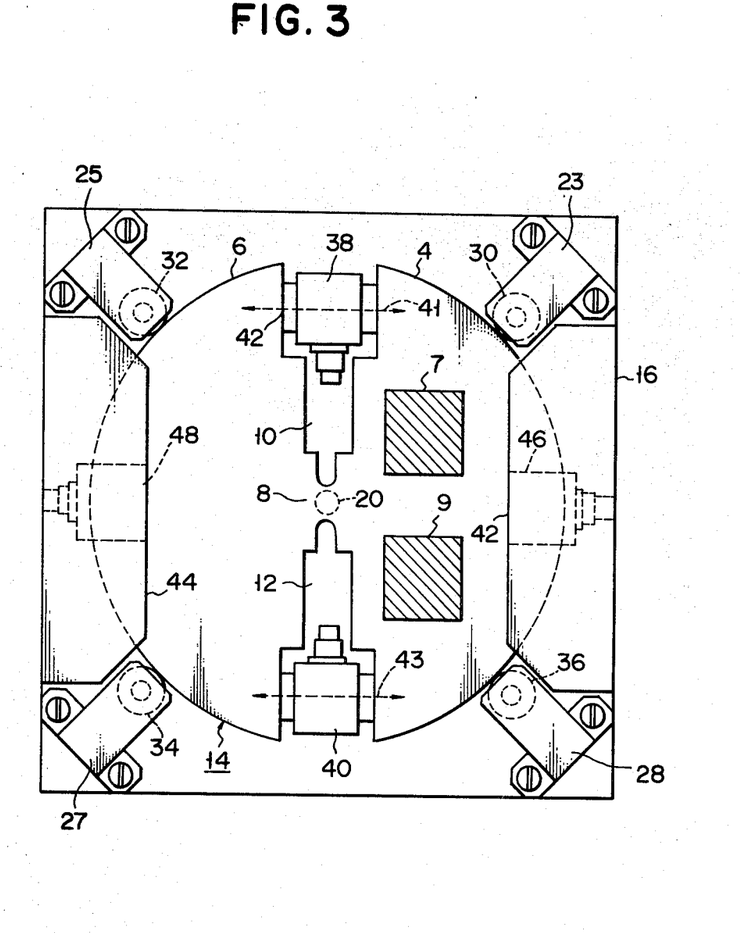
FIG. 3 is a plan view showing the fine rotation mechanism of FIG. 1 with a rotational table removed.

FIG. 1 shows a plan view of one embodiment of the fine rotation mechanism according to the invention. The fine rotation mechanism has a disc-like rotational table 2. As shown in FIG. 2, the rotational table 2 is secured to one of a first and a second semi-circular sections 4 and 6 of a movable member through support posts 7 and 9. As shown in FIG. 3, the first and second sections 4 and 6 are coupled together by an elastic hinge 8. The first and second sections 4 and 6 are usually formed by forming diametrically opposed notches 10 and 12 in a disc member 14 such that the notches extend toward the center of the disc. The portion of the disc 14 between the notches 10 and 12 corresponds to the elastic hinge 8, and the semi-circular sections of the disc defined by the notches 10 and 12 correspond to the respective sections 4 and 6. The rotational disc 14 which comprises the sections 4 and 6 and elastic hinge 8 has a smooth back surface, and it is rotatably mounted on a base member 16 having a smooth top surface. As shown in FIG. 3, the rotational disc 14 is formed with a center hole 18 of a truncated cone shape for receiving a ball bearing 20. The base member 16 is formed at a position corresponding to the center hole 18 with a through hole 22. A spring 24 is accommodated in the through hole 22. A screw 26 is screwed in the through hole 22. The ball bearing 20 fixed to a leaf spring 21 is thus urged by the spring 24 into the recess 18. The axis or rotation of the rotational disc 14 is defined by the center hole 18 and ball bearing 20, the axis passing through the center hole 18 and the elastic hinge. Bearing devices 23, 25, 27 and 28 are may be further provided, which are secured to the base member 16 such that they face the periphery of the rotational disc 14. The bearing devices 23, 25, 27 and 28 have respective bearings 30, 32, 34 and 36 which are in contact with the periphery of the rotational disc 14. The rotational disc 14 is rotatably supported by the bearing devices.

First and second rotational driving members 38 and 40 are provided in the respective notches 10 and 12 of the rotational disc 14. These rotational driving members 38 and 40 are piezoelectric elements, for instance made of lead titanate zirconate, which can be elongated and contracted according to a voltage applied to them. As shown in FIG. 3, the rotational driving members 38 and 40 are secured at their opposite sides in the direction of elongation and contraction to the corresponding side faces of the sections 4 and 6 by means of bonding, screw securement or force fitting. Support members 42 and 44 extend upright from the base member 16 such that they face each other. A first and a second stopper 46 and 48 are provided on the respective support members 42 and 44. In this embodiment, the stoppers 46 and 48, like the rotational driving members 38 and 40, are piezoelectric elements which can be elongated and contracted according to a voltage applied to them. As shown in FIG. 2. The stoppers 46 and 48 are secured at their one side in the direction of elongation and contraction 50, 52 to the respective support members 42 and 44 by means of bonding, screw securement or force fitting. Their other side faces the upper surface of the respective sections 4 and 6 with a slight gap formed between each of them and the corresponding section.

Where the fine rotation mechanism is used for an electron beam drawing system or lithography system, the rotational table 2, base member 16, sections 4 and 6 and associated parts are preferably made of a non-magnetic material such as berylium, copper, aluminum and titanium. Where these parts are made of a non-magnetic material, they do not have any influence on the magnetic field so that the drawing or transfer can be obtained with high precision.

Figure 4:
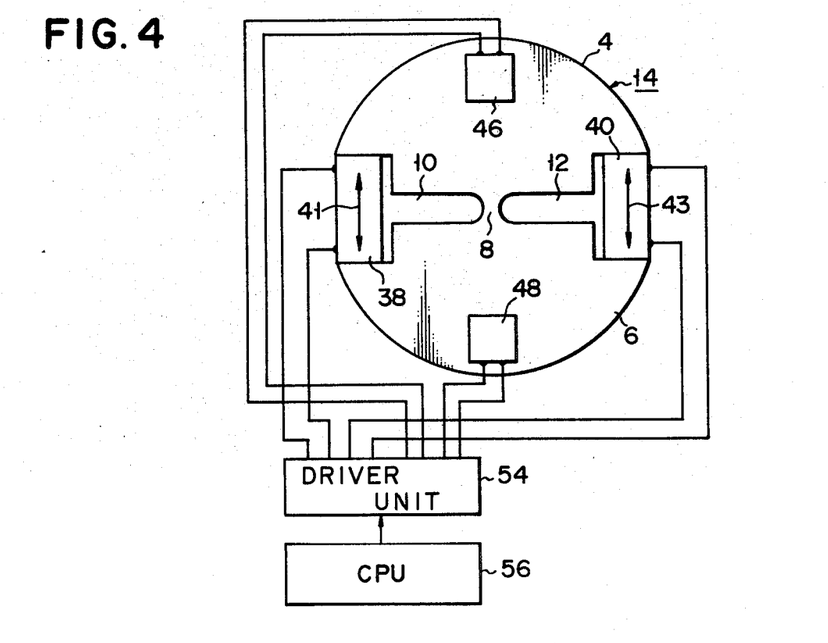
FIG. 4 is a block diagram showing a circuit for driving the fine rotation mechanism shown in FIG. 1.

The rotational driving members 38 and 40 and stoppers 46 and 48 are connected to a driver unit as shown in FIG. 4, which also shows the fine rotation mechanism of FIGS. 1 to 3 in a simplified form. The driver unit 54 is connected to a CPU 56.

Figure 5A:
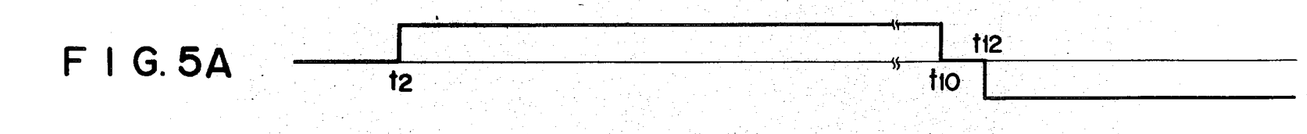
FIGS. 5A to 5E form a time chart showing signals generated from a CPU and a driver unit shown in FIG. 4.
Figure 5C:
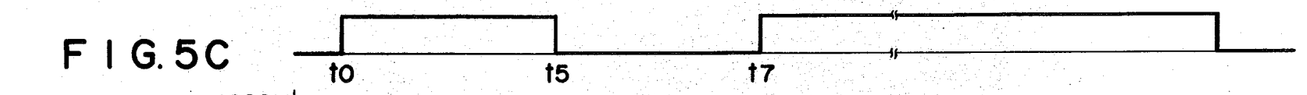
Figure 5D:
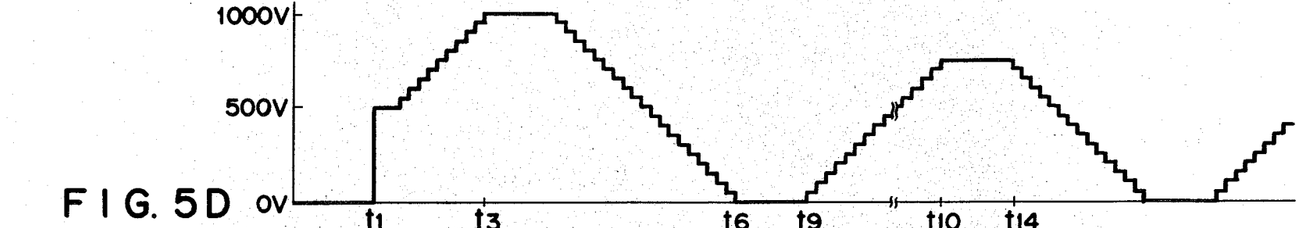
Figure 5E:
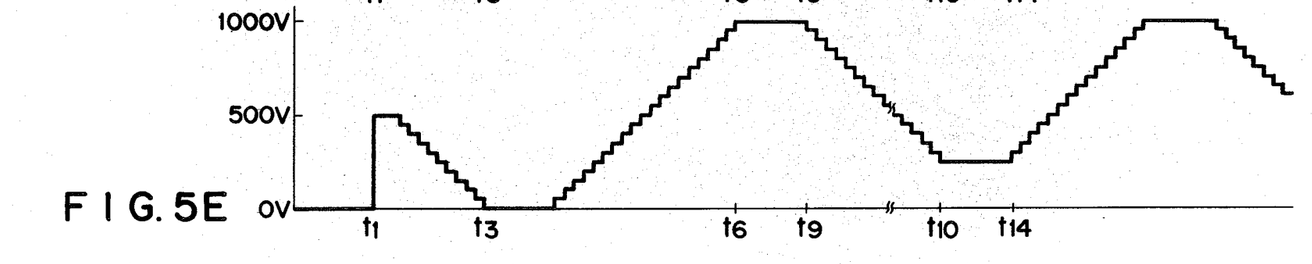
Figure 6A:
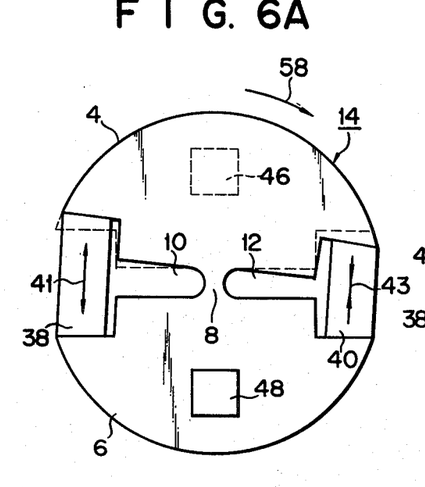
FIGS. 6A and 6B are views for explaining the operation of a rotational member shown in FIG. 1.

The operation of the fine rotation mechanism having the above construction will now be described with reference to FIGS. 5A to 5E. When a power switch (not shown) is closed at an instant $t_0$, a voltage as shown in FIG. 5C is applied from the driver 54 to the second stopper 48 to cause elongation thereof. Thus, the surface of the second stopper 48 facing the second section 6 is brought into contact with the second section 6 and locks the second section 6 against rotation. At a subsequent instant $t_1$, voltages as shown in FIGS. 5D and 5E, for instance 500 V, are applied from the driver 54 to the respective first and second rotational driving members 38 and 40 to cause elongation thereof to a certain extend. More particularly, the members, i.e., piezoelectric elements 38 and 40, are elongated to an extent corresponding to approximately one half the maximum elongation. This elongation is absorbed by the elastic hinge 8. At a subsequent instant $t_2$, a start signal of a positive level shown in FIG. 5A is supplied to the driver unit 54. When the start signal is generated, the voltage applied to the first rotational driving member 38 is increased stepwise at a rate determined by the CPU 56 as shown in FIG. 5D. Also, the voltage applied to the second rotational driving member 40 is decreased stepwise at the same rate as shown in FIG. 5E. The first rotational driving member 38 is thus progressively elongated from the half-elongated state and is reached to the maximum length state, at an instant $t_3$. The second rotational driving member 40, on the other hand, is progressively contracted from the half-elongated state and is reached to the minimum length at the instant $t_3$. That is, during the period from the instant $t_2$ to the instance $t_3$, at which the second section 6 is locked while the first section 4 is released and, the first rotational driving member 38 is elongated while the second rotational driving member 40 is contracted. Consequently, the section 4 is slightly rotated in the clockwise direction 58 as shown in FIG. 6A. The strain produced in the rotational disc 14 with the slight rotation of the section 4 is absorbed by the elastic hinge 8. The section 4 is thus rotated about the ball bearing 20. With this rotation, the rotational table 2 which is secured to the section 4 through the support posts 7 and 9 is also rotated in the direction 58.

Figure 5B:
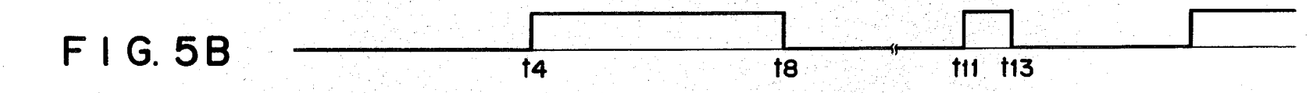
Figure 6B:
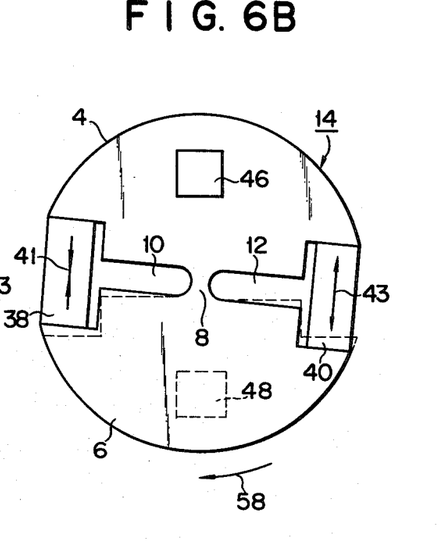

At an instant $t_4$, a certain voltage as shown in FIG. 5B is also applied to the first stopper 46, causing the elongation thereof. Thus, the first section 4 is locked against rotation by the stopper 46. After both the sections 4 and 6 have been locked, more particularly at a subsequent instant $t_5$, the voltage applied to the second stopper 48 disappears so that the stopper 48 is contracted and restored to its initial state. In other words, the second section 6 is released from the locked state by the stopper 48 so that it is ready to be moved. During a period from the instance $t_5$ to an instance $t_6$, the first rotational driving member 38 is contracted while the second rotational driving member 40 is elongated. Consequently, the second section 6 at this time is slightly rotated in the clockwise direction 58 as shown in FIG. 6B. It is to be noted that in this embodiment the rotational table 2 is secured to the first section 4 so that it is not rotated when the second section 6 is rotated since the first section 4 is not rotated. At an instant $t_6$, the first and second rotational driving members 38 and 40 reach their minimum and maximum lengths respectively. At a subsequent instant $t_7$, the second section 6 is locked again, and at a subsequent instant $t_8$, the first section 4 is released. From a subsequent instant $t_9$, the first rotational driving member 38 is elongated while the second rotational driving member 40 is contracted. Thus, the first section 4 is slightly rotated again in the same manner before as shown in FIG. 6A.

With the first and second sections 4 and 6 rotated alternately in the manner as described, the rotational table 2 can be rotated at a desired angle in the clockwise direction. After the rotational table 2 has been rotated a given angle, the start signal terminates, that is, a stop signal of zero level as shown in FIG. 5A is supplied from the CPU 56 to the driver unit 5 at an instant $t_{10}$. At this instant $t_{10}$ the voltages applied to the first and second rotational driving members 38 and 40 are held at the levels as shown in FIGS. 5D and 5E. At an instant $t_{11}$ slightly after the instant $t_{10}$, both of the rotational driving members 4 and 6 are locked against rotation by the respective stoppers 46 and 48 as shown in FIGS. 5B and 5C. Thus, the rotational table 2 is locked in that state.

To rotate the rotational table 2 in the reverse direction, i.e., in the counterclockwise direction, a start signal at a negative level is supplied from the CPU 56 to the driver unit 54 from an instant $t_{12}$. At a subsequent instant $t_{13}$, the first stopper 46 is released and the first and second rotational driving members 38, 40 are begun to be contracted and to be elongated respectively. Thsum the rotational table 2 starts to be rotated slightly in the counterclockwise direction.

As has been shown, with the above embodiment it is possible to rotate the rotational table 2 slightly and also provide a large rotational stroke. Further, fine adjustment of the rotational table 2 can be readily obtained by adjusting the voltages applied to the rotational driving members 38 and 40.

Figure 7:
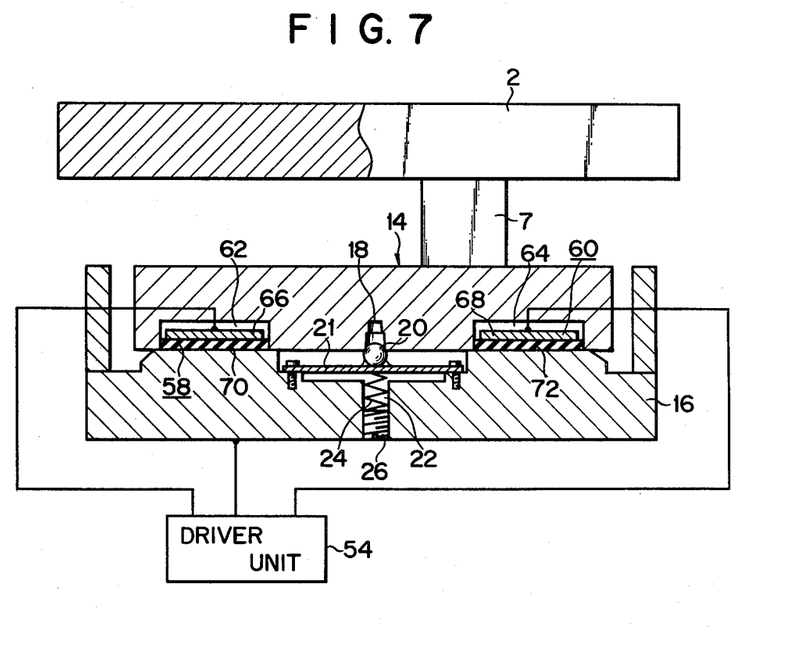
FIG. 7 is a plan view showing a rotational member in a different embodiment of the invention.

FIG. 7 shows a modification of the above embodiment. In this arrangement, electrostatic chuck devices 58 and 60 are used instead of the piezoelectric elements as the stoppers 46 and 48. The electrostatic chuck devices 58 and 60 are received in recesses 62 and 64 formed in the lower surface of the first and second rotational driving members 4 and 6. These electrostatic chuck devices respectively include electrodes 66 and 68 and dielectric members 70 and 72. The undersides of the dielectric members 70 and 72 are in contact with the surface of the base member 16. While no voltage from the driver unit 54 is applied between the base member 16 and the electrodes 66 and 68, the sections 4 and 6 are held movable on the base member 16. When a voltage from the driver unit 54 is applied between the base member 16 and electrodes 66 and 68, the dielectric members 70 and 72 are urged against the base member 16 by the forces of attraction between the base member 16 and the electrodes 66 and 68. In this state, the sections 4 and 6 are locked against rotation with respect to the base member 16.

While in the previous embodiment of FIG. 3 the rotational disc 14 has been rotatably supported by the bearing devices 23, 25, 27 and 28, the same effects may be obtained by rotatably supporting the rotational table 2 instead of the rotational disc 4 with the bearing devices 23, 25, 27 and 28. Further, each of the stoppers 46 and 48 may be comprised of a combination of a lever and a piezoelectric element. With the stoppers using levers, the sections 4 and 6 can be reliably locked against rotation.

Figure 8:
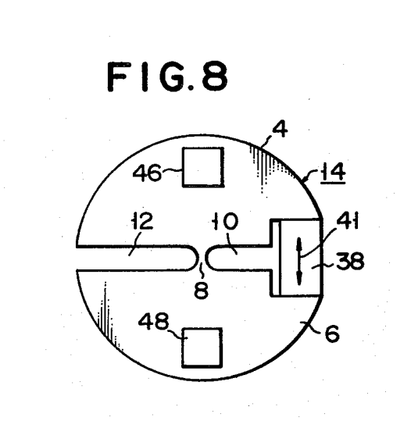
FIGS. 8 to 11 are plan views showing rotational plates in further embodiments of the invention.
Figure 9:
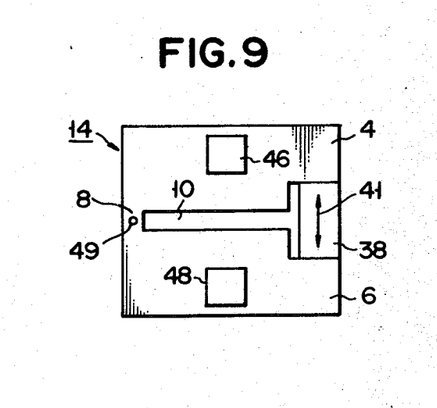
Figure 10:
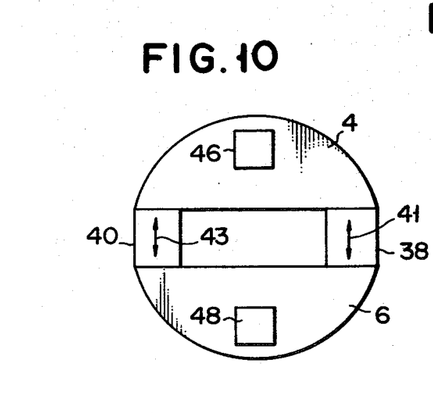
Figure 11:
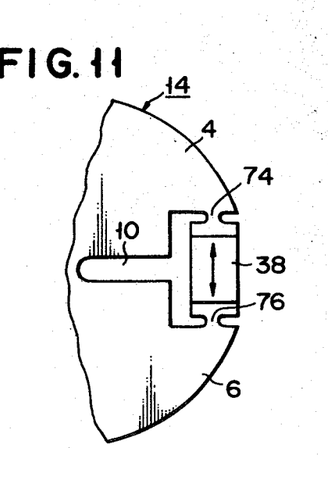

FIGS. 8 to 11 show various modifications of FIGS. 3 and 4. In FIG. 8, only one rotational driving member 38 is used for rotating the rotational table 14. In FIG. 9, the elastic hinge 8 is provided not at the center of the rotational disc 14 but at the edge of the rotational disc 14. In this case, the rotational disc 14 can be rotated about an axis 49 at the edge. The first and second sections 4 and 6 may not be coupled together by the elastic hinge 8. Instead, they may be coupled together only by the rotational driving members 38 and 40, as shown in FIG. 10. In this case, the first and second sections 4 and 6 can be rotated about the center of the assembly of the sections 4 and 6. Further, the electrostatic chuck devices mentioned above may be provided on the base member 16 instead of the sections 4 and 6. Further, the fine rotation mechanism according to the invention can be used as a sort of fine rotation motor so that its rotation is transmitted to a different mechanism for causing fine movement of an object. In the above embodiments strains are produced between the individual rotational driving members 38 and 40 and sections 4 and 6. The inclination that is involved, however, can in practice be ignored, for the elongation and contraction of the rotational driving members 38 and 40 are on the order of 5 $\mu$m. However, strain absorbing sections 74 and 76 may be provided between the rotational driving members and sections as shown in FIG. 11.

Figure 12:
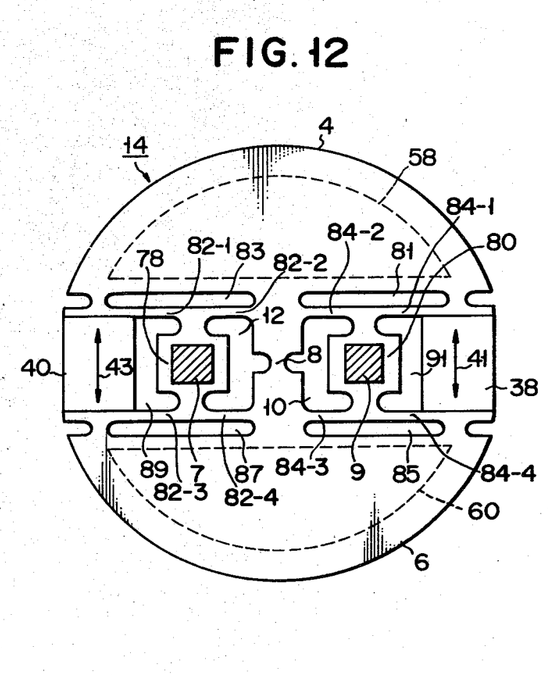
FIG. 12 is a plan view showing a rotational member in a further embodiment of the invention.
Figure 13A:
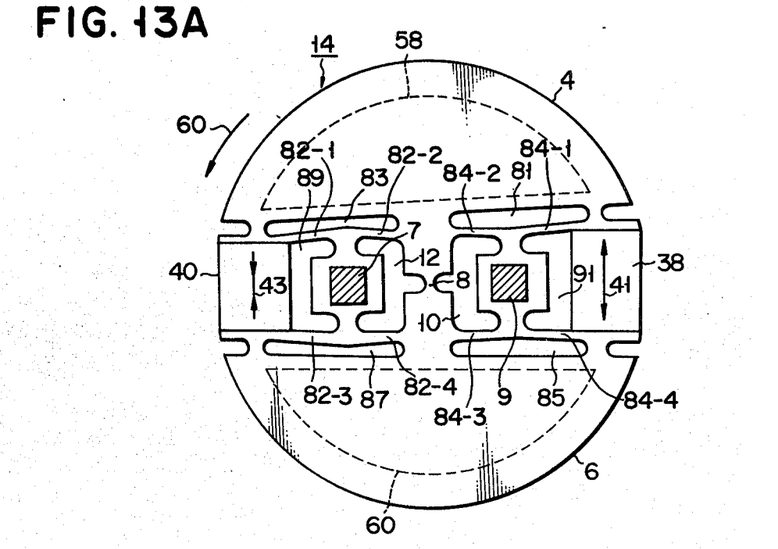
FIGS. 13A and 13B are views for explaining the operation of the rotational member shown in FIG. 12.
Figure 13B:
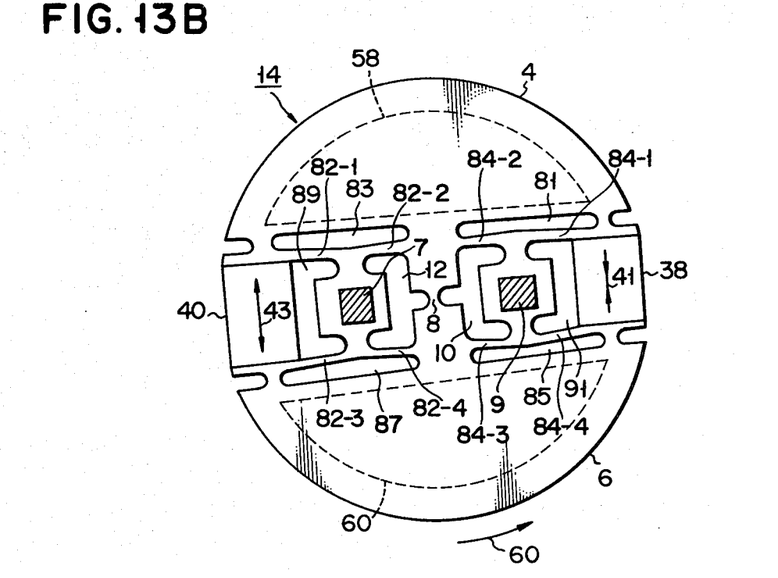
Figure 14:
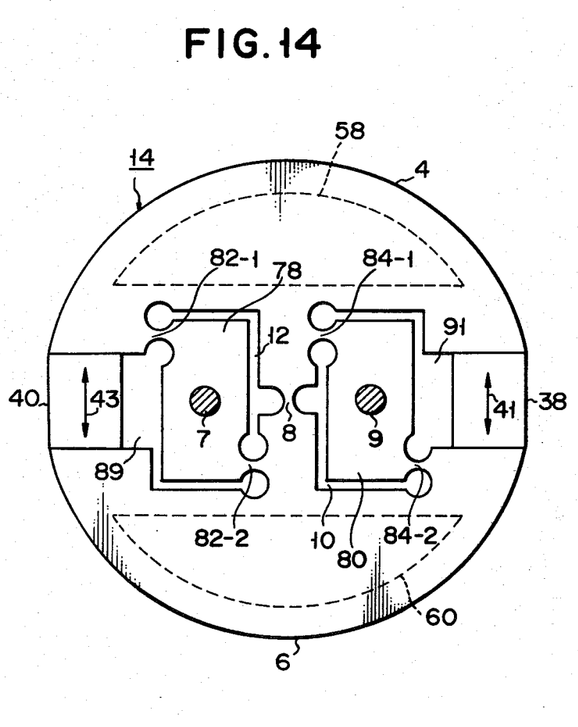
FIG. 14 is a plan view showing a modification of the rotational member shown in FIG. 12.

FIGS. 12 to 14 show a further embodiment of the invention. In this embodiment, the first and second rotational driving members 4 and 6 are coupled together by the hinge 8 and also by elastic coupling structures 82-1 to 82-4 and 84-1 to 84-4 having respective island segments 78 and 80. The support posts 7 and 9 for supporting the rotational table 2 are secured to the respective island segments 78 and 80. The sections 4 and 6, elastic hinge 8 and elastic coupling structures 82 and 84 are usually formed by monoblock-forming a disc member with symmetrical notches 10, 12, 81, 83, 85, 87 and 89 so that these parts constitute the rotational disc 14. The underside of the sections 4 and 6 is provided with electrostatic chucks 58 and 60 of FIG. 7 as stoppers as shown by dashed lines in FIG. 12.

With this construction, like the first embodiment of the fine rotation mechanism described before, the first section 4 can be rotated slightly about the hinge 8 as shown in FIG. 13A in the direction of arrow 60 by causing elongation of the first rotational driving member 38 and contraction of the second rotational driving member 40 with the second section 6 held attracted to the base member 16 by the second electrostatic chuck 60.

Then, the first section 4 is locked to the base member 16 with the first electrostatic chuck 58, and then the second section 6 is released from the state locked by the second electrostatic chuck 60. In this state, the second section 4 can be rotated slightly in the direction 60 shown in FIG. 13B by causing elongation of the second driving member 40.

In this construction, the island segments 78 and 80 of the elastic coupling structures 82 and 84 are elongated and contracted continuously while the members 4 and 6 are elongated and contracted intermittently. For this reason, when either one of the section 4 and 6 is rotated a certain angle, the island segments 78 and 80 of the elastic coupling structures 82 and 84 can be rotated substantially one half the angle. Thus, it is possible to obtain precise rotation control. Besides, the rotational precision of the rotational table 2 can be doubled compared to that of the mechanism of FIGS. 1 to 3. Further, vibrations accompanying the rotation can be absorbed by the elastic coupling structures 82 and 84.

With this embodiment, it is possible to provide torque continuously in addition to the possibilities of causing fine rotation of the rotational disc 14 and increasing the rotational stroke.

The elastic coupling structures 82 and 84 and island segments 78 and 80 may be constructed as shown in FIG. 14 which shows a modification of the embodiment of FIG. 12. With this arrangement, the rotational table 2 can be rotated with high precision.

Figure 15:
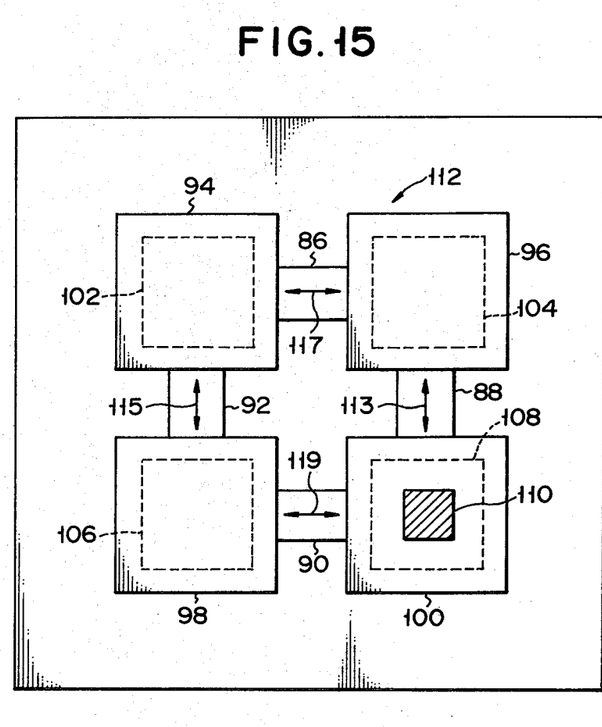
FIG. 15 is a plan view showing a movable member in a further embodiment of the invention.

FIG. 15 shows an another embodiment of the fine rotation mechanism according to the invention. In this embodiment, the rotational table 2 can not only be rotated but can also be linearly moved. The mechanism comprises a movable member 112, which includes rectangular sections 94, 96, 98 and 100 coupled to one another by driving members 86, 88, 90 and 92. Electrostatic chucks 102, 104, 106 and 108 as mentioned earlier are provided on the underside of the respective sections 94, 96, 98 and 100 as shown by dashed lines in FIG. 15. The sections 94, 96, 98 and 100 are mounted on the base member 16 via the respective chucks 102, 104, 106 and 108. The moving table 2 is secured to one of the sections 94, 96, 98 and 100 via a support post 110.

Figure 16A:
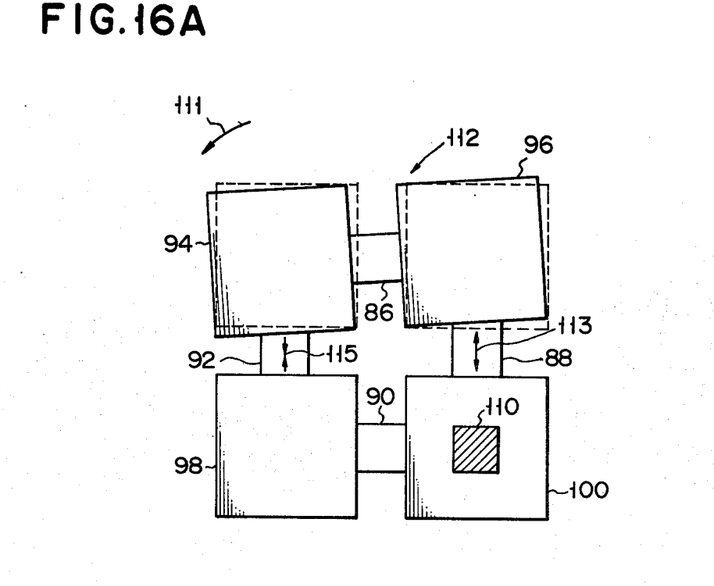
FIGS. 16A, 16B, 17A and 17B are views for explaining the operation of the movable member shown in FIG. 15, and FIGS. 18 and 19 are plan views showing modifications of the movable member shown in FIG. 15.
Figure 16B:
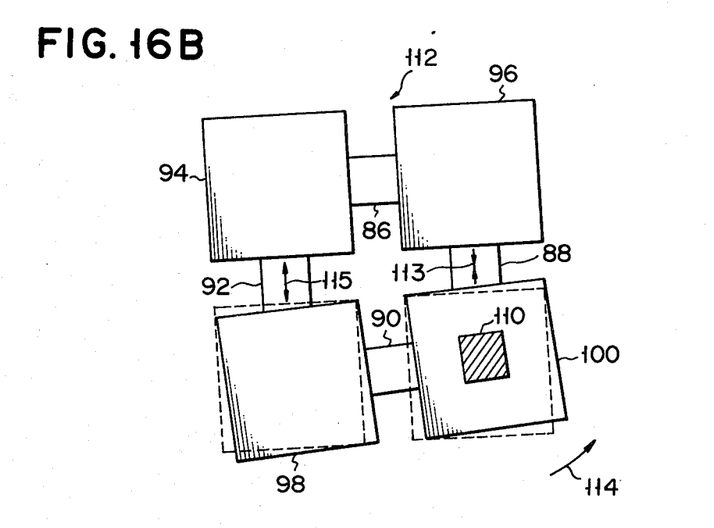

In operation for causing rotation of the moving table 2, after the sections 98 and 100 have been locked to the base member 16 with the electrostatic chucks 106 and 108, the driving member 88 is elongated in the direction of arrow 113 while the driving member 92 is contracted in the direction of arrow 115 as shown in FIG. 16A. Consequently, the sections 94 and 96 are rotated slightly in the direction of arrow 111. Then, the sections 94 and 96 are locked to the base member 16 with the electrostatic chucks 102 and 104 while the sections 98 and 100 are released from the state locked by the electrostatic chucks 106 and 108. In this state, the driving member 88 is contracted while the driving member 92 is elongated. In consequence, the sections 98 and 100 are rotated slightly in the direction of arrow 114 in FIG. 16B. When the above sequence of operationis repeated, the sections 94, 96, 98 and 100 are rotated in the directions of arrows 112 and 114 to rotate the rotational table 2.

Figure 17A:
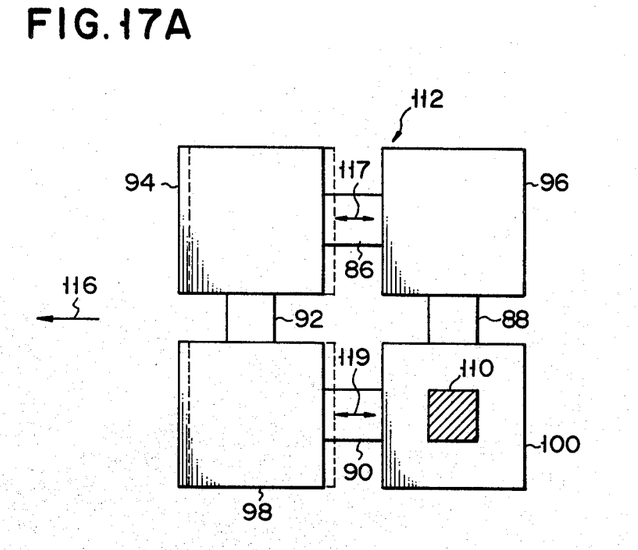
Figure 17B:
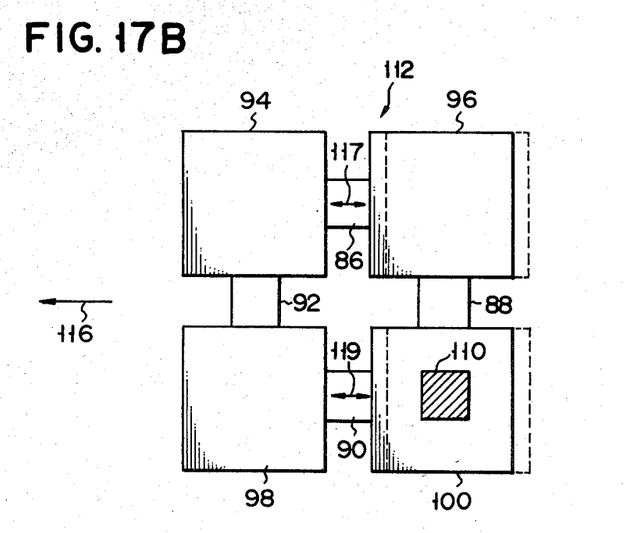

To cause linear motion of the rotational table 2, the sections 96 and 100 are locked to the base member 16 with the electrostatic chucks 104 and 108, and then the driving members 86 and 90 are elongated in the directions of arrows 117 and 119 respectively in FIG. 17A. Consequently, the sections 94 and 98 are linearly moved slightly in the direction of arrow 116. Then the sections 94 and 98 are locked to the base member 16 with the electrostatic chucks 102 and 106, and the sections 96 and 100 are released from the state locked by the electrostatic chucks 104 and 108. In this state, both the driving members 86 and 90 are contracted. Consequently, the sections 94 and 98 are again linearly moved slightly in the direction of arrow 116 in FIG. 17B. When the above sequence of operation is repeated, the sections 94, 96, 98 and 100 are moved linearly in the direction of arrow 116, thus linearly moving the rotational table 2 in the same direction.

As has been shown, with this embodiment the rotational table 2 can be rotated or linearly moved, and also its rotation and linear motion can be caused simultaneously. The direction of motion of the sections 94, 96, 98 and 100 can be freely set by appropriately selecting the sections 86, 88, 90 and 92 to be elongated or contracted and also the electrostatic chucks 102, 104, 106 and 108 to be activated for the locking action.

Figure 18:
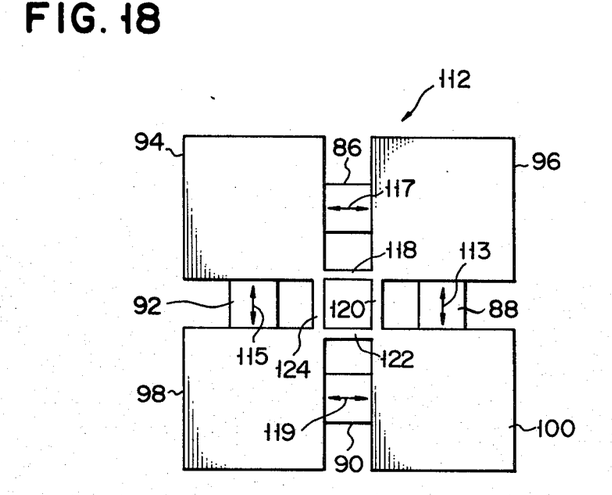
Figure 19:
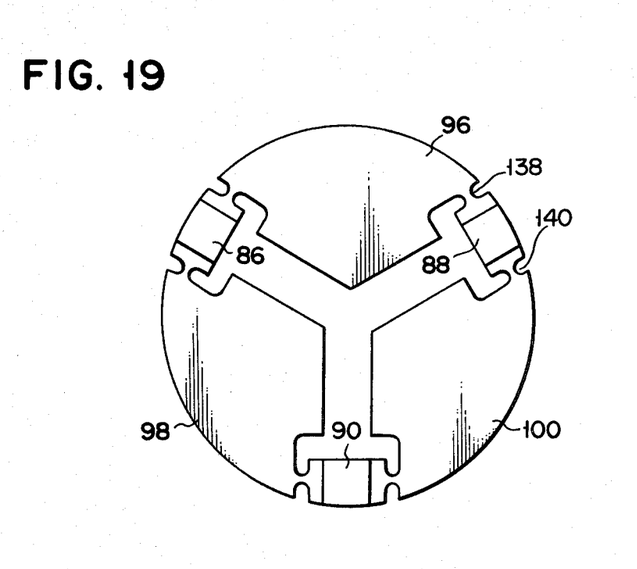

FIG. 18 is a plan view showing a modification of the embodiment of FIG. 15. In this embodiment, the sections 94, 96, 98 and 100 are further coupled together by elastic hinges 118, 120, 122 and 124 which make use of the elastic deformation of the material. With this arrangement, it is possible to alleviate shocks experienced by the movable member 112 at the time when the driving members 94, 96, 98 and 100 are elongated or contracted and also at the time when the sections are locked and released by the electrostatic chucks 102, 104, 106 and 108 as well as obtaining the same effects in the preceding embodiments. Furthermore, if the moving table 2 is secured to the elastic hinges 118, 120, 122 and 124, it is possible to obtain the motional force from the elastic hinges 118, 120, 122 and 124 and to continuously move the moving table. While in the embodiments of FIGS. 15 and 18 four sections and driving members have been used, these parts may be used in any suitable number at least three. FIG. 19 shows a further embodiment, which uses three sections 126, 128 and 130 and three driving member 96, 98 and 100. For rotation, the driving members 132 and 134 may be alternately elongated and contracted. For linear motion, the driving members 132 and 134 may be simultaneously elongated and contracted. Further, elastic hinges 138 and 140 which are provided between the individual sections 126, 128 and 130 and driving members 132, 134 and 136 can buffer strains produced in the individual parts.

As has been described in the foregoing, according to the invention, the inconvenience in the prior art fine rotation mechanism caused by the rotational stroke being extremely small can be covercome while permitting a slight motion. Theoretically, it is possible to rotate an object for at least one rotation. Thus it is possible to dispense with rotational members, for example gears and bearings, for rough motion and fine motion. Further, since the rotational member, i.e., the first and second sections, is directly driven by piezoelectric elements which serve as driving members, it is possible to reliably cause a fine motion, for instance of 0.005 $\mu$m with an applied voltage of 1 V. Further, since the bearing of a rotational shaft is dispensed with by providing an elastic hinge at the rotation center where rotational strain is generated, it is possible to prevent rattling when the rotational member is driven. Further, the members having the piezoelectric effect are capable of generating a force of several hundred kilograms to several tons although the force depends upon the magnitude of the applied voltage. Since the rotational member is directly driven by these members, it is possible to provide a fine rotation mechanism which can generate high torque. In this case, a slip of sections locked by locking members may occur. This can be overcome suitably adjusting the urging force of the locking members depending upon the torque transmitted.

Further, since the fine rotation mechanism according to the invention has a very simple construction and does not use any part subject to trouble, it can be used as a sufficiently reliable unit when assembled in measuring instruments and various semiconductor manufacturing devices. Further, in an apparatus using charged particles such as an electron beam and an ion beam, the charged particles are influenced by variations in a magnetic field. According to the invention, all the component parts can be made of nonmagnetic materials, so that the invention is very useful for apparatuses using charged particles.

The embodiments described above are by no means limitative. For example, in an application to a semiconductor manufacturing apparatus where a sample is rotated and also where the stability of the position of the subsequent stop of the sample is important, electrostatic chucks may be provided for the aforementioned elastic coupling structures so that the structures may be chucked after they have been properly positioned. By so doing, it is possible to eliminate vibrations of the system due to external disturbances.

Further, the electrostatic chucks used as stoppers for locking the sections to the base member, may be replaced with vacuum chucks or electromagnetic chucks. Further, it is possible to adopt a system in which sections are mechanically clamped. Further, the driving unit for driving the driving members may be constructed in various ways to suit the use. For example, it may be constructed such that a high voltage may be applied when it is desired to cause a very rough motion while a low voltage may be applied when it is desired to cause a fine motion. Further, the fine rotation mechanism according to the invention can be used as a sort of fine rotation motor, and the rotation of the mechanism may be transmitted to an other mechanism to cause a fine motion of an object.

Various further changes and modifications are possible without departing from the scope and spirit of the invention.

What is claimed is new and desired to be secured by letters patent of the United States is:

1. A precision rotation mechanism comprising:
   a base having a surface;
   a rotor rotatably mounted on the surface of said base and including first and second sections;
   means for defining the rotation center of said rotor;
   a first piezoelectric element capable of elongation and contraction which is coupled between the first and second sections of said rotor in the direction of elongation and contraction;
   a first and a second stopper for locking the respective first and second sections against rotation about said center of rotation;
   means for driving the second stopper to lock the second section after driving the first stopper to lock the first section, and then driving said first stopper to release said first section; and
   a first signal generating means for generating a first voltage signal applied to said first piezoelectric element, said first piezoelectric element being elongated or contracted according to the first voltage signal, while one of said two sections is held locked by the corresponding stopper.

2. The precision rotation mechanism according to claim 1, wherein said rotor further includes an elastic hinge provided at the rotation center of said rotor and coupled between said first and second sections of said rotor.

3. The precision rotation mechanism according to claim 1 or 2, which further comprises a second piezoelectric element capable of elongation and contraction which is coupled with said first and second sections of said rotor in the direction elongation and contraction, the rotation center of said rotor being defined between said first and second piezoelectric elements.

4. The precision rotation mechanism according to claim 3, which further comprises second signal generating means for generating a second voltage signal applied to said second piezoelectric element, said second piezoelectric element being elongated or contracted according to the second voltage signal while one of said sections of said rotor is held locked by the corresponding stopper, said second piezoelectric element being contracted when said first piezoelectric element is elongated and said second piezoelectric element being elongated when said first piezoelectric element is contracted.

5. The precision rotation mechanism according to claim 1, wherein said first and second stoppers are piezoelectric elements capable of elongation and contraction and urging the corresponding sections against said base to lock said sections when said stoppers are elongated.

6. The precision rotation mechanism according to claim 1, wherein said first and second stoppers are electrostatic chucks each including an electrode and a dielectric member and attract the corresponding sections to said base to lock the sections when said stoppers are energized.

7. The precision rotation mechanism according to claim 1 or 4, wherein said piezoelectric element is made of lead titanate zirconate.

8. The precision rotation mechanism according to claim 1, wherein said base and rotor are made of a non-magnetic material.

9. The precision rotation mechanism according to claim 8, wherein said non-magnetic material is selected from a group consisting of beryllium, copper, aluminum and titanium.

10. The precision rotation mechanism according to claim 2, wherein said rotor and elastic hinge are formed by forming a plate member with notches.

11. The precision rotation mechanism according to claim 1, which further comprises a rotational table secured to either one of said sections and rotatable with said section.

12. The precision rotation mechanism according claim 1, wherein said rotor further includes a first segment provided between said first and second sections and elastic coupling structures for elastically coupling said third section to said first and second sections.

13. The precision rotation mechanism according to claim 12, wherein said rotor further includes:
   a second segment provided between said first and second section, the rotation center of said rotor being defined between said first and second segments; and
   elastic coupling structures for elastically coupling said second segment to said first and second sections.

14. The precision moving mechanism according to claim 12, which further comprises a rotational table secured to said first segment and rotatable together with said first segment.

15. A precision rotation mechanism comprising:
   a base having a surface;
   a rotor rotatably mounted on said base and having first, second and third sections;
   first, second and third piezoelectric elements capable of elongation and contraction, said first piezoelectric element being coupled between said first and second sections, said second piezoelectric element being coupled between said second and third sections, said third piezoelectric element being coupled between said third and first sections;

first, second and third stoppers for locking said respective first, second and third sections against rotation;

means for driving said stoppers for locking the corresponding sections; and means for generating a voltage signal applied to each piezoelectric element for causing elongation or contraction thereof, said rotor being linearly moved or rotated with elongation or contraction of given ones of said piezoelectric elements caused by the corresponding stoppers driven by said voltage signal generating means.

16. The precision moving mechanism according to claim 15, in which said rotor further includes a fourth section, and which further comprises a fourth piezoelectric element capable of elongation and contraction, said fourth and first sections being coupled by said fourth piezoelectric element, said third and fourth sections being coupled together by said third piezoelectric element.

17. The precision moving mechanism according to claim 15 or 16, wherein said second and third stoppers are piezoelectric elements capable of elongation and contraction and urging the corresponding sections against said base to lock when said stoppers are elongated.

18. The precision moving mechanism according to claim 15 or 16, wherein said first and second stoppers are electrostatic chucks each including an electrode and a dielectric member and atrract the corresponding sections to said base to lock the sections when said stoppers are energized.

19. The precision moving mechanism 15 or 17, wherein said piezoelectric element is made of lead titanate zironate.

20. The precision moving mechanism according to claim 15, wherein said base and rotor are made of a nonmagnetic material.

21. The precision moving mechanism according to claim 15, wherein said non-magnetic material is selected from a group consisting of beryllium, copper, aluminum and titanium.

22. The precision moving mechanism according to claim 15, which further comprises a rotational table secured to either one of said sections and rotatable with said sections.

23. The mechanism of claim 1 wherein said first and second sections of said rotor are separated from each other and are coupled by said first piezoelectric element.

24. The mechanism of claim 15 wherein said first, second and third sections of said rotor are separated from each other and are coupled by said first, second and third piezoelectric elements.

* * * * *